United States Patent
Suh et al.

(10) Patent No.: US 7,244,634 B2
(45) Date of Patent: Jul. 17, 2007

(54) STRESS-RELIEF LAYER AND STRESS-COMPENSATION COLLAR IN CONTACT ARRAYS, AND PROCESSES OF MAKING SAME

(75) Inventors: Daewoong Suh, Phoenix, AZ (US); Saikumar Jayaraman, Chandler, AZ (US); Mohd Erwan P. Bin Basiron, Pulau Pinang (MY); Sheau Hooi Lim, Penang (MY); Yoong Tatt P. Chin, Penang (MY)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 10/815,968

(22) Filed: Mar. 31, 2004

(65) Prior Publication Data

US 2005/0221534 A1   Oct. 6, 2005

(51) Int. Cl.
 *H01L 21/00* (2006.01)
(52) U.S. Cl. ............... 438/108; 438/612; 257/E21.514
(58) Field of Classification Search ............... 438/108, 438/612; 257/E21.514
See application file for complete search history.

(56) References Cited

U.S. PATENT DOCUMENTS

| 5,570,506 | A | 11/1996 | Tawata et al. |
| 6,555,414 | B1 | 4/2003 | Vanfleteren et al. |
| 6,774,497 | B1 | 8/2004 | Qi et al. |
| 6,821,878 | B2 | 11/2004 | Danvir et al. |
| 2002/0185309 | A1* | 12/2002 | Imamura et al. ............ 174/261 |
| 2003/0096453 | A1* | 5/2003 | Wang et al. ................ 438/108 |
| 2003/0218261 | A1* | 11/2003 | Capote et al. .............. 257/787 |
| 2004/0060963 | A1* | 4/2004 | Ludwig et al. ............. 228/103 |
| 2004/0118599 | A1 | 6/2004 | Chason et al. |
| 2005/0224951 | A1 | 10/2005 | Suh et al. |

\* cited by examiner

*Primary Examiner*—Bradley Smith
(74) *Attorney, Agent, or Firm*—Schwegman, Lundberg, Woessner & Kluth, P.A.

(57) ABSTRACT

A stress-relief layer is formed by dispensing a polymer upon a substrate lower surface under conditions to partially embed a solder bump that is disposed upon the lower surface. The stress-relief layer flows against the solder bump. A stress-compensation collar is formed on a board to which the substrate is mated and the SCC partially embeds the solder bump. An article that exhibits a stress-relief layer and a stress-compensation collar is also included. A computing system that includes a stress-relief layer and a stress-compensation collar is also included.

21 Claims, 9 Drawing Sheets

STRESS-RELIEF LAYER AND STRESS-COMPENSATION COLLAR IN CONTACT ARRAYS, AND PROCESSES OF MAKING SAME

TECHNICAL FIELD

Disclosed embodiments relate to a stress-relief layer and a stress-compensation collar in a microelectronic device package.

BACKGROUND INFORMATION

Chip packaging is often intensely involved with heat removal. Thermal expansion-mismatch challenges exist between the die, the underfill material, and the substrate to which the die is mounted and to connecting structures such as the motherboard. The thermal mismatch often is exhibited at the joint of a solder bump and its bond pad.

One method of dealing with solder bump stress on a motherboard is to encapsulate the solder bumps at the corners with an underfill layer. This method only encapsulates solder bumps at the periphery of the package. It does not encapsulate the solder bumps at the center.

Future packaging technology especially in the chipset application, will drive finer pitch as package size shrinks. With miniaturization of pitch, smaller ball size poses an increasing challenge to solder joint performance.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" or "processor" generally refer to the physical object that is the basic workpiece that is transformed by various process operations into the desired integrated circuit device. A board is typically a conductor-overlay structure that is insulated and that acts as a mounting substrate for the die. A board is usually singulated from a board array. A die is usually singulated from a wafer, and wafers may be made of semiconducting, non-semiconducting, or combinations of semiconducting and non-semiconducting materials.

A "solder bump" and "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. The embodiments may be referred to, individually and/or collectively, herein by the term "invention" merely for convenience and without intending to voluntarily limit the scope of this disclosure to any single invention or inventive concept if more than one is in fact disclosed. In some embodiments, structures known in the art may not have been included to maintain the clarity of the drawings.

Figure 1A:
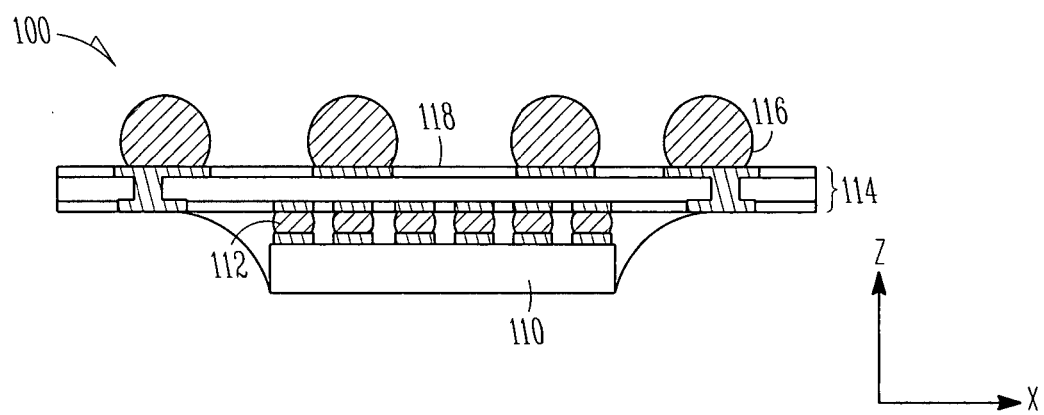
FIG. 1A is a cross-section elevation of a chip package during processing according to an embodiment.

FIG. 1A is a cross-section elevation of a chip package 100 during processing according to an embodiment. The chip package 100 includes a die 110 that is coupled through a plurality of die solder bumps, one of which is designated with the reference numeral 112. In an embodiment, the chip package 100 includes chip-scale packaging dimensions. By "chip-scale packaging dimensions", it is meant that the footprint of the chip package 100 is in a range from about 120% the largest characteristic dimension of the die 110, to about 200% the largest characteristic dimension of the die 110. Where the die 110 is substantially square, the largest characteristic dimension is an edge of the die 110.

Only six die solder bumps 112 are depicted for clarity of illustration. The die solder bump 112 couples the die 110 to a substrate 114, which is depicted as a laminated structure. The die solder bump 112 is disposed on the die side of the substrate 114.

In an embodiment, the substrate 114 is a second level substrate such as an interposer for a processor. In an embodiment, the substrate 114 is part of a printed wiring board (PWB) such as a main board. In an embodiment, the substrate 114 is part of a mezzanine PWB. In an embodiment, the substrate 114 is part of an expansion card PWB. In an embodiment, the substrate 114 is part of a small PWB such as a board for a hand-held device such as a cell phone or a personal digital assistant (PDA). In an embodiment, the substrate 114 is the base board of a device such as a hand-held device, and the stress-relief layer technology set forth in this disclosure is applied to the die solder bump 112.

In an embodiment the chip package 100 is also bumped on the land side 118 of the substrate 114 by a plurality of pre-attached solder first bumps, one of which is designated with the reference numeral 116. Although only four solder first bumps 116 are depicted, the number is reduced for clarity of illustration. Where the expression "solder bump" or something enumerating a solder bump in a sequence is set forth, it is understood that it is an electrical coupling as well as a mechanical coupling. Consequently, the term solder bump is synonymous with "electrical bump" where other electrical couplings can be interchanged with a solder coupling.

Figure 1B:
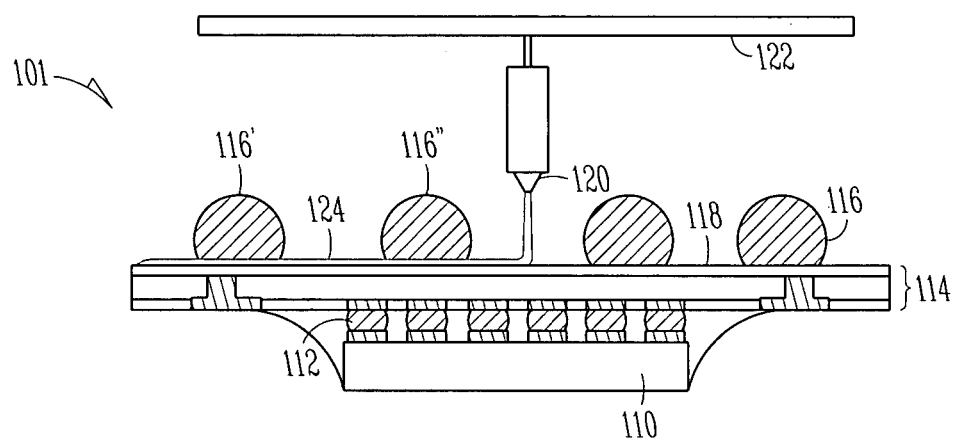
FIG. 1B is a cross-section elevation of the chip package depicted in FIG. 1A during further processing according to an embodiment.

FIG. 1B is a cross-section elevation of the chip package 100 depicted in FIG. 1A during further processing according to an embodiment. The chip package 101 is depicted in connection with a dispenser 120 that is operated with an X-Y gantry 122 according to an embodiment. The dispenser 120 and the X-Y gantry 122 can be obtained from a commercial vendor such as Asymtek of Carlsbad, Calif., which manufactures jet-ejecting equipment. The dispenser 120 is depicted dispensing a substantially continuous stream of a mass such as a polymer underfill material 124 to partially embed the solder first bump 116 as a stress-relief layer (SRL) 124. In an embodiment, the dispenser 120 dispenses a substantially discrete series of quanta of polymer underfill material (see FIGS. 6A, 8, and 9).

Various materials are used as the underfill material of the SRL 124, including resins according to an embodiment. In an embodiment, an epoxy is used. In an embodiment, a cyanate ester composition or the like is used. In an embodiment, a polyimide composition or the like is used. In an embodiment, a polybenzoxazole composition or the like is used. In an embodiment, a polybenzimidazole composition or the like is used. In an embodiment, a polybenzothiazole composition or the like is used. In an embodiment, a combination of any two of the compositions is used. In an embodiment, a combination of any three of the compositions is used. In an embodiment, a combination of any four of the compositions is used. In an embodiment, a combination of all five of the compositions is used. Other polymer compositions can be used as the underfill material alone, or in combination with the enumerated polymer compositions.

In an embodiment, a polybenzoxazole is used by ejecting it onto the land side 118 in place, and by curing. In an embodiment, curing includes thermal curing the polymer(s). In an embodiment, curing includes cross-link curing the polymer(s). In an embodiment, curing includes cyclization curing the polymer(s). In an embodiment, curing includes at least two of the above curing operations.

In an embodiment, a prepolymer is in non-cyclized form as it is ejected onto the land side 118 before it is further processed, such as by heating to a temperature over its glass transition temperature ($T_G$). Upon heating, the prepolymer begins to cyclize and thereby cure, by reacting with functional groups nearby, and in the process by releasing water molecules. This cyclization changes the prepolymer from its non-cyclized state to its cyclized state, and to different properties that are exhibited between the two states.

In an embodiment, a stress-relief layer is a polybenzoxazole prepolymer that is synthesized by reacting di hydroxylamines with di acids, to form a hydroxy amide. The hydroxy amide is ejected onto the land side 118 of the substrate 114 and is heated by infrared (IR) heating, by microwave heating, or by a combination thereof. Other heating such as conductive and/or convective heating may be carried out. The heating process begins to convert the prepolymer to a closed-ring polybenzoxazole.

In an embodiment, the thermal stability of the SRL 124 exceeds about 450° C. Generally, the SRL 124 is substantially chemically inert and substantially insoluble after thermal processing. In an embodiment the SRL 124 has a dielectric constant in a range from about 1 to about 3. In an embodiment, the SRL 124 has a dielectric constant of about 2.5.

In an embodiment, a poly (o-hydroxyamide) precursor is dissolved and ejected onto the land side 118 of the substrate 114 as an uncured SRL 124. The uncured SRL 124 is in a non-cyclized state. The $T_G$ of the hydroxyamide is also about 75 to 100° C. lower than when SRL 124 is further cured. The hydroxyamide is next cured to a temperature of about 75 to 100° C. higher than the uncured $T_G$. Curing allows the SRL 124 to retain permanent features. During thermal processing, conversion of uncured polymer from a poly(hydroxyamide) to a fully cyclized poly benzoxazole SRL 124 occurs. The $T_G$ shifts upwardly to about 75 to 100° C. higher than the uncured SRL 124.

Figure 1C:
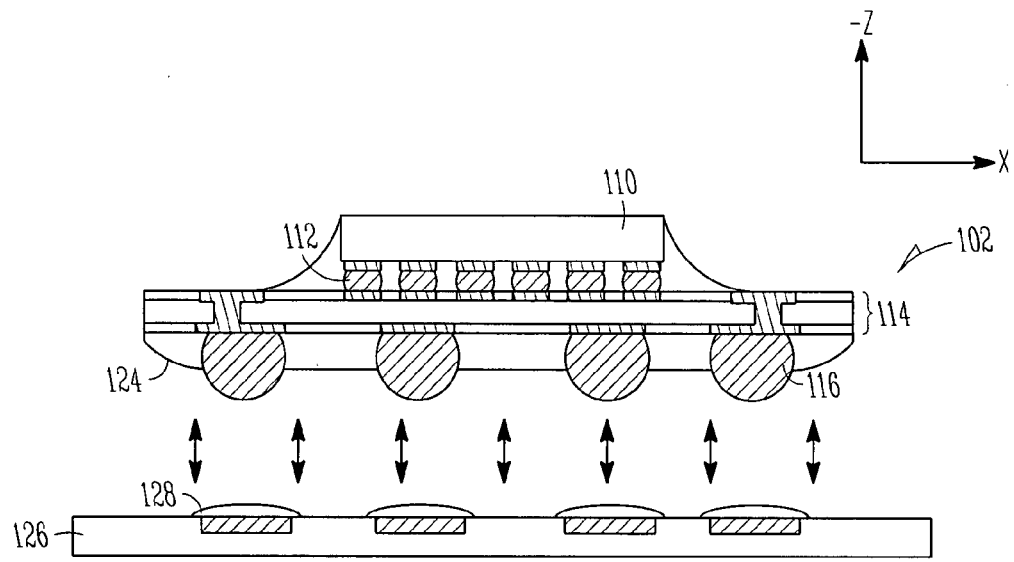
FIG. 1C is a cross-section elevation of the chip package depicted in FIG. 1B during further processing according to an embodiment.

FIG. 1C is a cross-section elevation of the chip package 101 depicted in FIG. 1B during further processing according to an embodiment. The chip package 102 is being mated to a board 126. Processing depicted in FIG. 1C includes the substrate 114 having been inverted and the substrate 114 and the board 126 are being directed toward each other as indicated by the directional arrows.

In an embodiment, the board 126 is prepared with a plurality of pre-applied stress-compensation collar (SCC) precursor spots, one of which is designated with the reference numeral 128. The pre-applied SCC precursor spots 128 provide a stress-compensating structure to offset any stresses that are borne in the SRL 124 as stresses are transferred between substrate 114 and board 126.

In an embodiment, the pre-applied SCC precursor spots 128 include flux that reacts chemically at increasing temperatures to release acids that reduce metal-oxides that are present between the bond pad on the board 126 and the solder first bump 116.

Figure 1D:
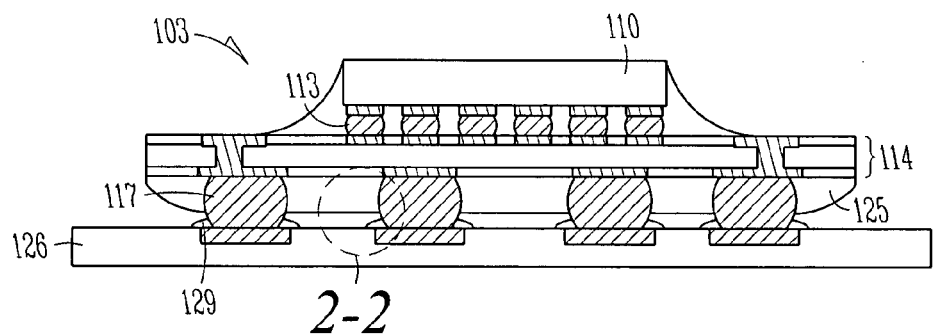
FIG. 1D is a cross-section elevation of the chip package depicted in FIG. 1C during further processing according to an embodiment.

FIG. 1D is a cross-section elevation of the chip package 102 depicted in FIG. 1C during further processing according to an embodiment. The chip package 103 has been mated by assembling the die 110 and the substrate 114 onto which it is mounted, with the board 126. Assembly has been accomplished by pushing the solder first bumps 116 through the pre-applied SCC precursor spots 128 (FIG. 1C). Thereafter, the stress-compensation collar precursor spots 128 are depicted as a stress-compensation collar, one of which is designated as an SCC with the reference numeral 129.

After applying the substrate 114 to the board 126, the SRL 125 (SRL 124 in FIG. 1C, if it has not yet been processed) and the SCC 129 are cured by any curing process that is appropriate for the specific materials selected for the SCC 129. In an embodiment, prior to or simultaneously with curing the SCC 129, reflowing of the solder first bumps 117 (solder first bumps 116 in FIG. 1C) is accomplished. Optionally, the die solder bumps 113 (die solder bumps 112 in FIG. 1C) are also reflowed simultaneously therewith.

Figure 2:
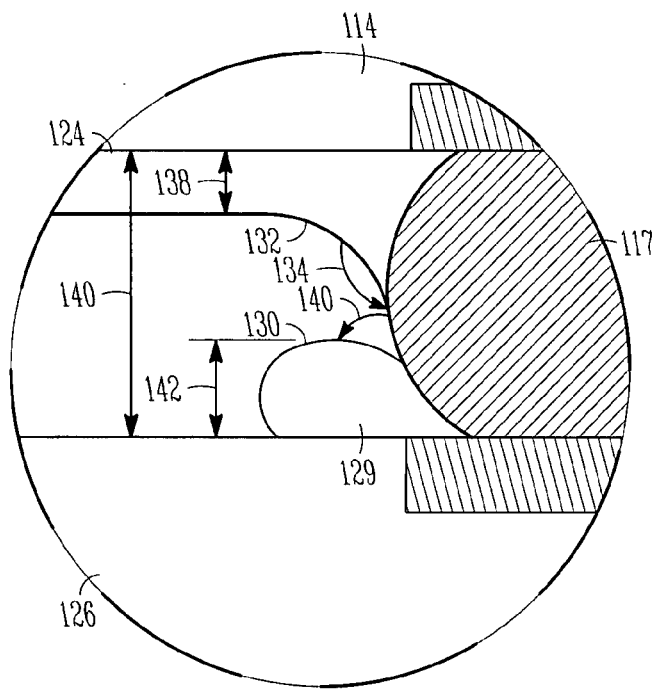
FIG. 2 is a detail section taken from FIG. 1D according to an embodiment.

FIG. 2 is a detail section 2-2 taken from FIG. 1D according to an embodiment. The detail section 2-2 illustrates the topology of the chip package 101 at an occurrence of a solder first bump 117, the SRL 125, and the SCC 129. Various metrics can be used to quantify the resulting structure that includes the solder first bump 117 in relation to the SCC 129.

Processing conditions dictate the respective surfaces in relation to the size of the solder first bump 117, and in relation to the wetting qualities of the respective SCC 129 and the SRL 125 upon the solder first bump 117 and neighboring structures such as the substrate 114 and the board 126. In an embodiment, the SCC 129 and the SRL 125 are depicted as having a non-wetting surface 130 and a fillet surface 132, respectively. In FIG. 2, the SRL 124 exhibits a higher degree of wetting upon the solder first bump 117 than that of the SCC 129. The contact angle 134 of the SRL 124 is depicted as obtuse. Contrariwise, the contact angle 140 of the SCC upon the board 128 is depicted as acute. For the SCC 129 and the SRL 124, it can be appreciated that any combination of obtuse, right, and acute contact angles including both contact angles being the same type can be achieved according to process, design, and implementation considerations.

In an embodiment, the amount of the solder first bump 117 that is exposed below the fillet surface 132 is about seven-eighths or greater, measured by the height 138 of the SRL 124, divided by the major vertical characteristic dimension 140 of the solder first bump 117. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the amount of the solder first bump 117 that is exposed above the non-wetting surface 130 is about seven-eighths or greater, measured by the SCC height 142, divided by the major vertical characteristic dimension 140 of the solder first bump 117. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the material of the SCC 129 includes an organic composition that includes a non-fugitive element in the composition. The non-fugitive element is calculated to remain and to compensate for stresses that are transferred from the substrate 114 to the board 126.

In an embodiment, the material of the SCC 129 includes an epoxy solder paste (ESP). By "epoxy" it is understood to be a thermoplastic or thermosetting composition that can be cured to perform under ordinary operating conditions required in chip packages. In an embodiment, the material of the SCC 129 includes an epoxy flux (EF). In an embodiment, the material of the SCC 129 includes combinations of ESP and EF.

In an embodiment, the material of the SCC 129 includes an EF that includes a resin-containing flux. In an embodiment, the EF includes a cyanate ester-containing flux. In an embodiment, the EF includes a polyimide-containing flux. In an embodiment, the EF includes a polybenzoxazole-containing flux. In an embodiment, the EF includes a polybenzimidazole-containing flux. In an embodiment, the EF includes a polybenzothiazole-containing flux. In an embodiment, the EF includes a combination of two of the EFs set forth herein. In an embodiment, the EF includes a combination of three of the EFs set forth herein. In an embodiment, the EF includes a combination of four of the EFs set forth herein. In an embodiment, the EF includes a combination of five of the EFs set forth herein.

In an embodiment, the material of the SCC 129 includes an ESP that includes a paste. In an embodiment, the ESP includes a solder paste. In an embodiment, the ESP includes an epoxy-containing solder paste. In an embodiment, the ESP includes a resin-containing paste. In an embodiment, the ESP includes a cyanate ester-containing paste. In an embodiment, the ESP includes a polyimide-containing paste. In an embodiment, the ESP includes a polybenzoxazole-containing paste. In an embodiment, the ESP includes a polybenzimidazole-containing paste. In an embodiment, the ESP includes a polybenzothiazole-containing paste. In an embodiment, the ESP includes a combination of two of the ESPs set forth herein. In an embodiment, the ESP includes a combination of three of the ESPs set forth herein. In an embodiment, the ESP includes a combination of four of the ESPs set forth herein. In an embodiment, the ESP includes a combination of five of the ESPs set forth herein. In an embodiment, the ESP includes a combination of six of the ESPs set forth herein. In an embodiment, the ESP includes a combination of seven of the ESPs set forth herein.

Figure 3:
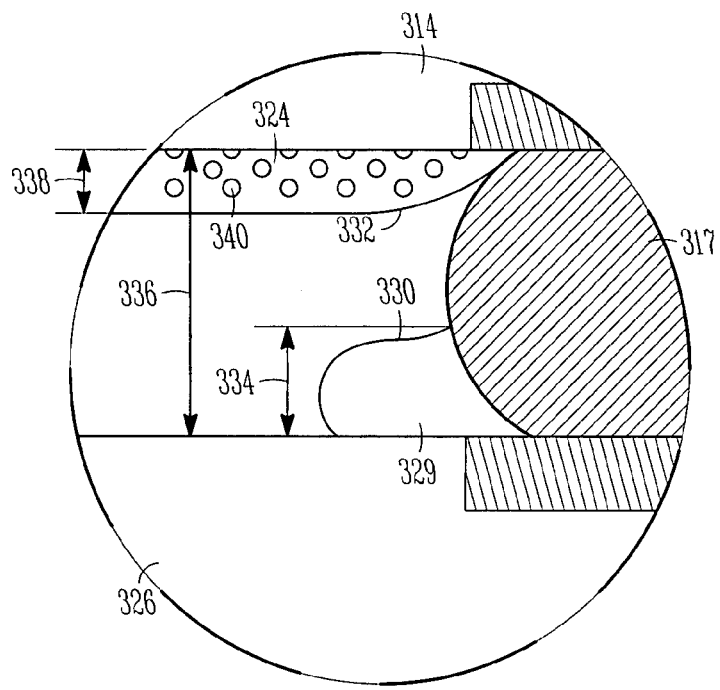
FIG. 3 is a detail section taken from FIG. 1D according to an embodiment.

FIG. 3 is a detail section 2-2 taken from FIG. 1B according to an embodiment. The detail section 2-2 illustrates the topology of the chip package 101 at an occurrence of a solder first bump 317, an SRL 324, and an SCC 329. Various metrics can be used to quantify the resulting structure that includes the solder first bump 317 in relation to the SCC 329.

Processing conditions dictate the respective surfaces in relation to the size of the solder first bump 317, and in relation to the wetting qualities of the respective SCC 329 and the SRL 324 upon the solder first bump 317 and neighboring structures such as the substrate 314 and the board 326. In an embodiment, the SCC 329 and the SRL 324 are depicted as having a fillet surface 330 and a non-wetting surface 332, respectively. In FIG. 3, the SRL 324 exhibits a lower degree of wetting upon the solder first bump 317 than that of the SCC 329. For the SCC 329 and the SRL 324, it can be appreciated that any combination of obtuse, right, and acute contact angles including both contact angles being the same type can be achieved according to process, design, and implementation considerations.

In an embodiment, the amount of the solder first bump 317 that is exposed above the fillet surface 330 is about seven-eighths or greater, as measured by the SCC height 334, divided by the major vertical characteristic dimension 336. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the amount of the solder first bump 317 that is exposed below the non-wetting surface 332 is about seven-eighths or greater, measured by the SRL height 338, divided by the major vertical characteristic dimension 336 of the solder first bump 317. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

Additionally, the SRL 324 is filled with a particulate 340 that assists the SRL 324 to have a coefficient of thermal expansion (CTE) that facilitates a lower thermal mismatch between neighboring structures. In an embodiment, the particulate 340 is silica or the like. In an embodiment, the particulate 340 is ceria or the like. In an embodiment, the particulate 340 is zirconia or the like. In an embodiment, the particulate 340 is thoria or the like. In an embodiment, the particulate 340 is a combination of two or more particulates. Other dielectric particulates 340 may be used alone, or in combination with enumerated particulates.

In an embodiment, the particulate 340 is present in a range from about 1 percent to about one-half or greater the total weight of the SRL 324 after it has been fully cured for field use. In an embodiment, the particulate 340 is in a range from about 2 percent to about 30 percent. In an embodiment, the particulate 340 is in a range from about 5 percent to about 25 percent. In an embodiment, the particulate 340 is in a range from about 10 percent to about 20 percent.

The coefficient of thermal expansion (CTE) of the SRL 324 is alterable by the presence and weight percent of the particulate 340. In an embodiment, the SRL 324 as filled with the particulate (hereinafer SRL 324) includes a composite CTE in a range from about 9 ppm/° C. to about 40 ppm/° C. In an embodiment, the SRL 324 includes a composite CTE in a range from about 15 ppm/° C. to about 35 ppm/° C. In an embodiment, the SRL 324 includes a composite CTE in a range from about 20 ppm/° C. to about 30 ppm/° C. The specific CTE can be selected within these ranges, or outside these ranges according to an application, and can be selected to balance adhesion of the SRL 324 to the substrate 314 and to provide stress-relieving qualities based upon a known thermal load under operating conditions of the die.

Figure 4A:
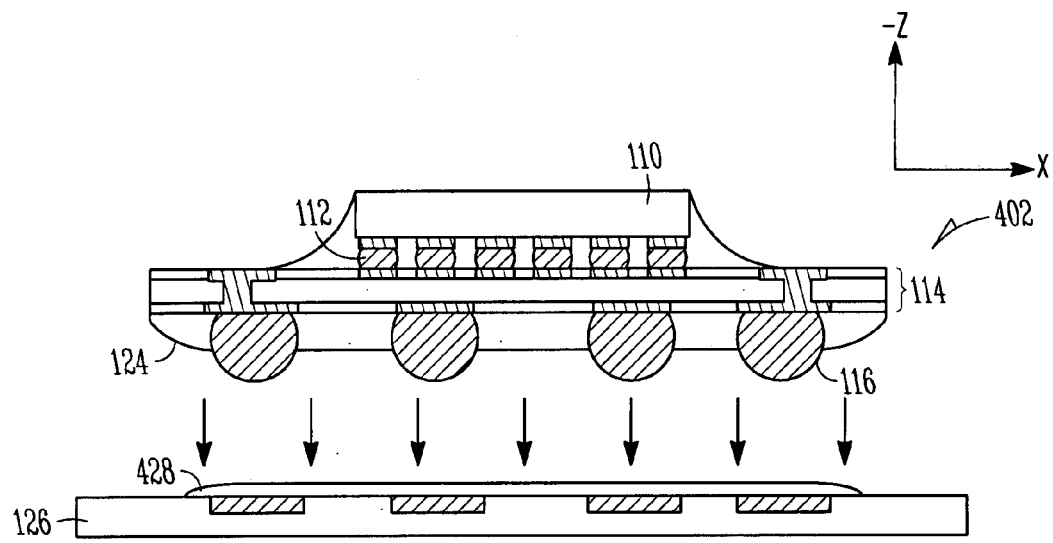
FIG. 4A is a cross-section elevation of the chip package depicted in FIG. 1B during further processing according to an embodiment.

FIG. 4A is a cross-section elevation of the chip package 101 depicted in FIG. 1B during further processing according to an embodiment. The chip package 402 is being mated to the board 126. Processing depicted in FIG. 4A includes the substrate 114 having been inverted and being directed toward the board 126 as indicated by the directional arrows between the substrate 114 and the board 126.

In an embodiment, the board 126 is prepared with a pre-applied stress-compensation collar (SCC) precursor 428. The pre-applied SCC precursor 428 provides a stress-compensating structure to offset any stresses that are borne in the SRL 124 as stresses are transferred between the substrate 114 and the board 126.

In an embodiment, the pre-applied SCC precursor 428 includes a flux that reacts chemically at increasing temperatures to release acids that reduce metal-oxides that are present between the bond pad on the board 126 and the solder first bump 116.

Figure 4B:
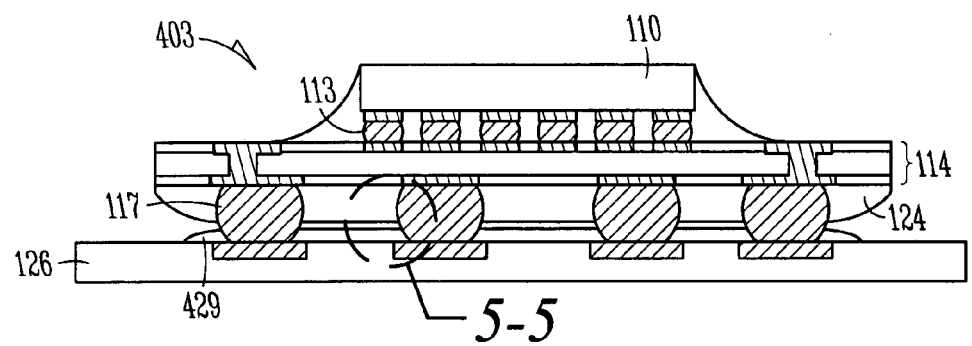
FIG. 4B is a cross-section elevation of the chip package depicted in FIG. 4A during further processing according to an embodiment.

FIG. 4B is a cross-section elevation of the chip package 402 depicted in FIG. 4A during further processing according to an embodiment. The chip package 403 has been mated by assembling the die 110 and the substrate 114 onto which it is mounted, with the board 126. Assembly has been accomplished by pushing the solder first bumps 116 (FIG. 4A) through the pre-applied SCC precursor 428. Thereafter, the pre-applied SCC precursor 428 is depicted as a stress-compensation collar 429.

After applying the substrate 114 to the board 126, the SRL 125 (if it has not yet been processed) and the SCC 429 is cured by any curing process that is appropriate for the specific materials selected for the SCC 429. In an embodiment, prior to or simultaneously with curing the SCC 429, reflowing of the solder first bumps 117 is accomplished. Optionally, the die solder bumps 113 are also reflowed simultaneously therewith.

Figure 5:
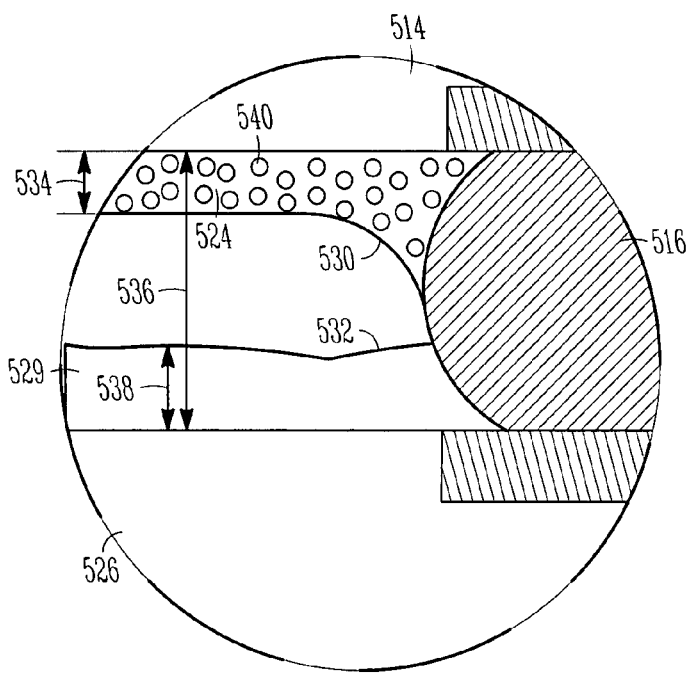
FIG. 5 is a detail section taken from FIG. 4B according to an embodiment.

FIG. 5 is a detail section 5-5 taken from FIG. 4B according to an embodiment. The detail section 5-5 illustrates the topology of the chip package 403 at an occurrence of a solder first bump 516, an SRL 524, and an SCC 529. Various metrics can be used to quantify the resulting structure that includes the solder first bump 516 in relation to the SCC 529.

In an embodiment, the SCC 529 includes an organic composition that includes a non-fugitive element in the composition. The non-fugitive element is calculated to remain and to compensate for stresses that are transferred from the substrate 514 to the board 526.

In an embodiment, the material of the SCC 529 includes an ESP. In an embodiment, the material of the SCC 529 includes an EF. In an embodiment, the material of the SCC 529 includes combinations of ESP and EF.

In an embodiment, the material of the SCC 529 includes an EF that includes a resin-containing flux. In an embodiment, the EF includes a cyanate ester-containing flux. In an embodiment, the EF includes a polyimide-containing flux. In an embodiment, the EF includes a polybenzoxazole-containing flux. In an embodiment, the EF includes a polybenzimidazole-containing flux. In an embodiment, the EF includes a polybenzothiazole-containing flux. In an embodiment, the EF includes a combination of two of the EFs set forth herein. In an embodiment, the EF includes a combination of three of the EFs set forth herein. In an embodiment, the EF includes a combination of four of the EFs set forth herein. In an embodiment, the EF includes a combination of five of the EFs set forth herein.

In an embodiment, the material of the SCC 529 includes an ESP that includes a paste. In an embodiment, the ESP includes a solder paste. In an embodiment, the ESP includes an epoxy-containing solder paste. In an embodiment, the ESP includes a resin-containing paste. In an embodiment, the ESP includes a cyanate ester-containing paste. In an embodiment, the ESP includes a polyimide-containing paste. In an embodiment, the ESP includes a polybenzoxazole-containing paste. In an embodiment, the ESP includes a polybenzimidazole-containing paste. In an embodiment, the ESP includes a polybenzothiazole-containing paste. In an embodiment, the ESP includes a combination of two of the ESPs set forth herein. In an embodiment, the ESP includes a combination of three of the ESPs set forth herein. In an embodiment, the ESP includes a combination of four of the ESPs set forth herein. In an embodiment, the ESP includes a combination of five of the ESPs set forth herein. In an embodiment, the ESP includes a combination of six of the ESPs set forth herein. In an embodiment, the ESP includes a combination of seven of the ESPs set forth herein.

Processing conditions can influence the respective surfaces in relation to the size of the solder first bump 516, and in relation to the wetting qualities of the respective SCC 529 and the SRL 524 upon the solder first bump 516 and neighboring structures such as the substrate 524 and the board 526. In an embodiment, the SCC 529 and the SRL 524 are depicted as having a fillet surface 530 and a non-wetting surface 532, respectively. For the SCC 529 and the SRL 524, it can be appreciated that any combination of obtuse, right, and acute contact angles including both contact angles being the same type can be achieved according to process, design, and implementation considerations.

In an embodiment, the amount of the solder first bump 516 that is exposed below the fillet surface 530 is about seven-eighths or greater, as measured by the SRL 524 height 534, divided by the major vertical characteristic dimension 536 of the solder first bump 516. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one fourth. In an embodiment, the amount is about one-eighth or less. In an embodiment, the amount is about 10%. In an embodiment, the amount is in a range from about 5% to about 95%.

In an embodiment, the amount of the solder first bump 516 that is exposed above the non-wetting surface 532 is about seven-eighths or greater, as measured by the SRL 529 height 538, divided by the major vertical characteristic dimension 536 of the solder first bump 516. In an embodiment, the amount is about one-fourth. In an embodiment, the amount is about 90%. In an embodiment, the amount is about three-fourths. In an embodiment, the amount is about five-eighths. In an embodiment, the amount is about one-half. In an embodiment, the amount is about three-eighths. In an embodiment, the amount is about one-eighth or less. In an embodiment, the amount is about 10%. In an embodiment, the amount is in a range from about 5% to about 95%.

In an embodiment, the SRL 524 is filled with a particulate 540 that assists the SRL 524 to have a CTE that facilitates a lower thermal mismatch between neighboring structures. In an embodiment, the particulate 540 is silica or the like. In an embodiment, the particulate 540 is ceria or the like. In an embodiment, the particulate 540 is zirconia or the like. In an embodiment, the particulate 540 is thoria or the like. In an embodiment, the particulate 540 is a combination of two or more particulates. Other dielectric particulates 540 may be used alone, or in combination with enumerated particulates.

In an embodiment, the particulate 540 is present in a range from about 1 percent to about one-half or greater the total weight of the SRL 524 after it has been fully cured for field use. In an embodiment, the particulate 542 is in a range from about 2 percent to about 30 percent. In an embodiment, the particulate 542 is in a range from about 5 percent to about 25 percent. In an embodiment, the particulate 542 is in a range from about 10 percent to about 20 percent.

The CTE of the SRL 524 is alterable by the presence and weight percent of the particulate 542. In an embodiment, the SRL 524 as filled with the particulate 540 (hereinafer SRL 524) includes a composite CTE in a range from about 9 ppm/° C. to about 40 ppm/° C. In an embodiment, the SRL 524 includes a composite CTE in a range from about 15 ppm/° C. to about 35 ppm/° C. In an embodiment, the SRL 524 includes a composite CTE in a range from about 20 ppm/° C. to about 30 ppm/° C. The specific CTE can be selected within these ranges, or outside these ranges according to an application, and can be selected to balance adhesion of the SRL 524 to the substrate 514 and to provide stress-relieving qualities based upon a known thermal load under operating conditions of the die.

Figure 6A:
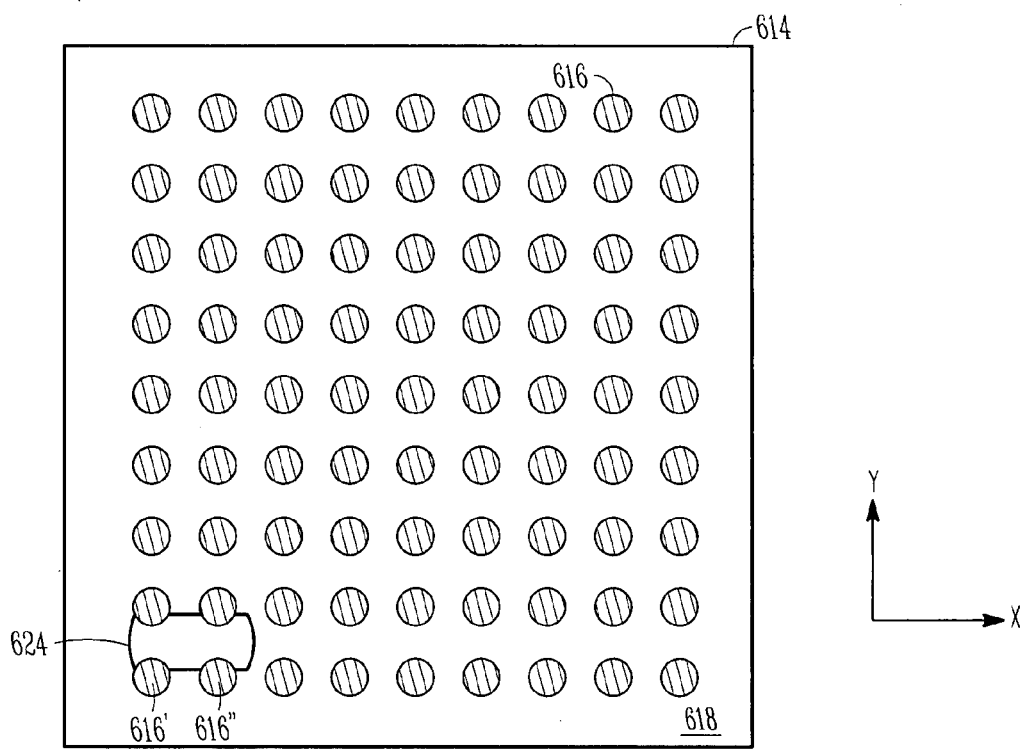
FIG. 6A is a plan of a chip package during processing according to an embodiment.

FIG. 6A is a plan of a chip package 600 during processing according to an embodiment. The chip package 600 includes a die (not pictured) that is coupled through a plurality of die solder bumps on the land side thereof, one of which is designated with the reference numeral 616. The solder bump 616 of the chip package 600 is pushed through an SCC precursor according to any of the embodiments set forth in this disclosure.

In an embodiment, the substrate 614 is a second level substrate such as an interposer for a processor. In an embodiment, the substrate 614 is part of a printed wiring board (PWB) such as a main board. In an embodiment, the substrate 614 is part of a mezzanine PWB. In an embodiment, the substrate 614 is part of an expansion card PWB. In an embodiment, the substrate 614 is part of a small PWB such as a board for a handheld device such as a cell phone or a personal digital assistant (PDA). In an embodiment, the die is represented as the substrate 614 and the land side 618 is represented as the active surface of the die 614 after appropriate metallization.

The land side 618 of the substrate 614 depicts a solder bump array that can also be referred to as a ball-grid array or the like. During processing, a dispenser (not pictured) deposits a substantially continuous stream of a mass for a stress-relief layer 624, that has made contact with a solder first bump 616' and a solder second bump 616". The solder first bump 616' and the solder second bump 616" are analogous to a solder first bump 116' and a solder second bump 116" as seen in FIG. 1B, while the dispenser 120 is operated with the X-Y gantry 122 to deposit the substantially continuous stream of the stress-relief layer 124.

In an embodiment, flow of the substantially continuous stream of an SRL 624 is carried out under conditions to cause the SRL 624 to at least partially flood around the solder first bump 616' and the solder second bump 616", such that the SRL 624 can substantially contact about half or more of the circumferences of the respective solder bumps.

Figure 6B:
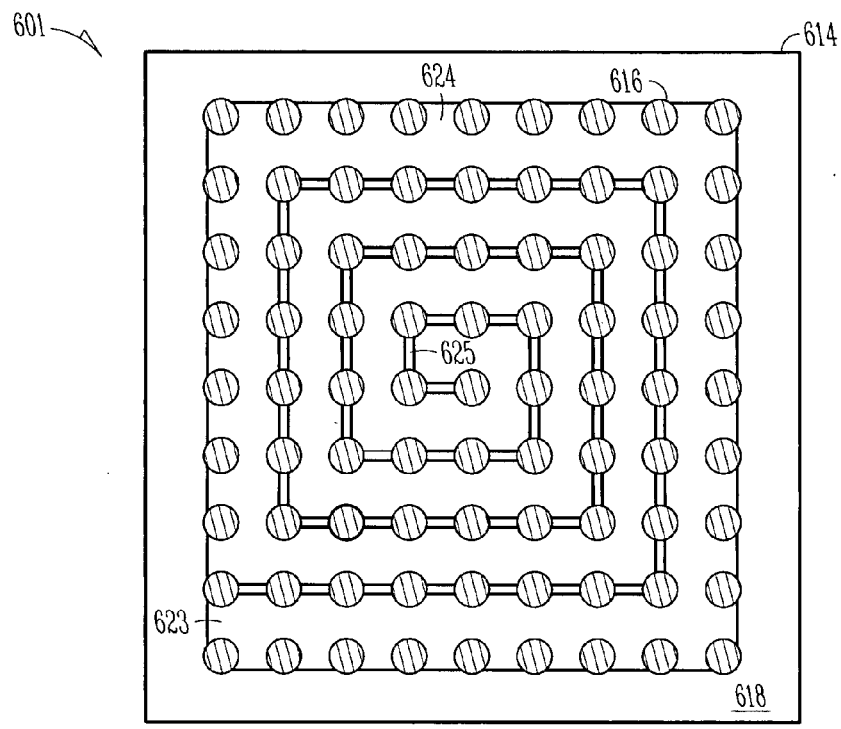
FIG. 6B is a plan of the chip package depicted in FIG. 6A during further processing according to an embodiment.

FIG. 6B is a plan of the chip package 600 depicted in FIG. 6A during further processing according to an embodiment. After the dispenser (not pictured) has completed laying down a substantially continuous stream of the SRL 624 onto the land side 618 of the chip package 601, the SRL 624 includes an origin 623 where the dispenser began to eject the SRL 624 onto the substrate 614, and a terminus 625 where the dispenser stopped dispensing according to an embodiment. As depicted in FIG. 6B, a spiral pattern is laid down of the substantially continuous SRL 624. In an embodiment, processing includes a higher flow rate along the peripheral solder bumps 616 such that the SRL 624 can substantially surround at least about half the circumferences of the peripheral solder bumps 616. Thereafter, the flow rate is decreased for the interior solder bumps 616. In an embodiment, the X-Y gantry translational speed is modified where the dispenser changes directions to cause substantially the same amount of SRL 624 to be metered while the X-Y gantry negotiates corners. In an embodiment, the X-Y gantry translational speed is not modified, but the flow rate of the dispenser is modified to be metered at different rates while the X-Y gantry negotiates corners. In any event, the amount of the SRL 624 that is metered to cover the solder first bumps 616 is an amount between about 5% and about 95% as set forth in this disclosure according to the various embodiments.

In an embodiment, other patterns can be achieved while forming the SRL 624. In an embodiment, a serpentine pattern can be dispensed where the solder bump count allows for a continuous stream of the SRL 624 to be metered onto the land side 618 of the substrate 614.

Figure 7A:
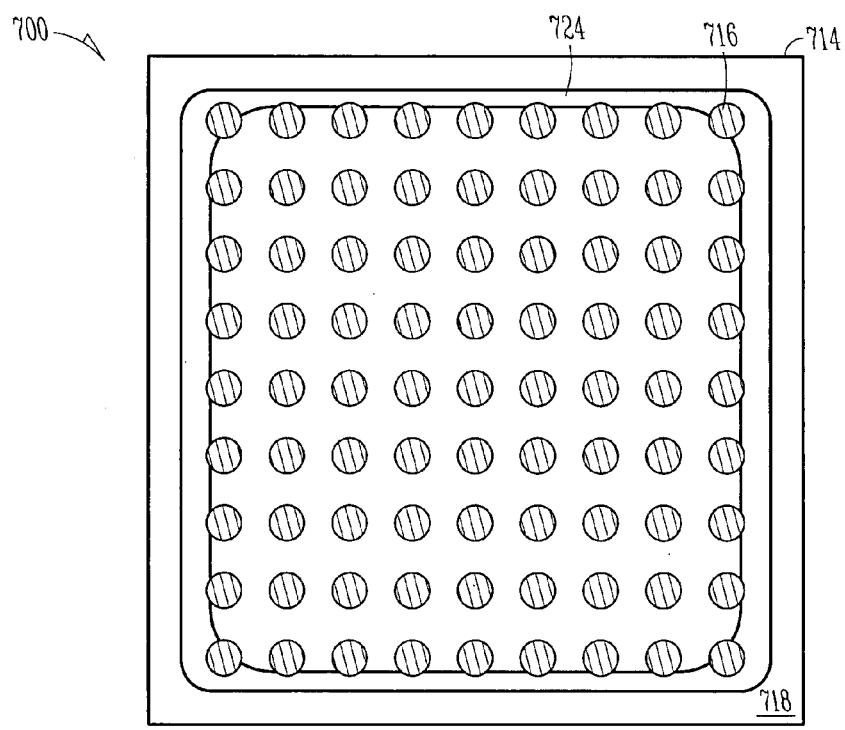
FIG. 7A is a plan of a chip package during processing according to an embodiment.

FIG. 7A is a plan of a chip package 700 during processing according to an embodiment. The chip package 700 includes a die (not pictured) that is coupled through a plurality of solder bumps on the land side thereof, one of which is designated with the reference numeral 716.

The land side 718 of the substrate 714 depicts a solder ball array. During processing a dispenser (not pictured) deposits a substantially continuous stream of a stress-relief layer 724 that forms a peripheral ring SRL 724 about the solder bumps 716.

Figure 7B:
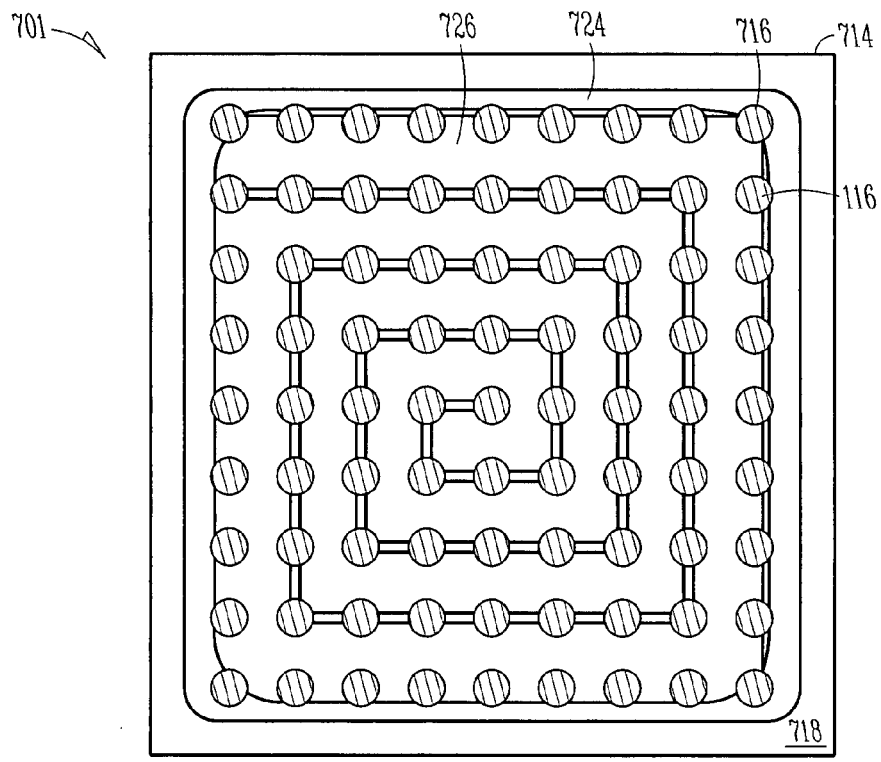
FIG. 7B is a plan of the chip package depicted in FIG. 7A during further processing according to an embodiment.

FIG. 7B is a plan of the chip package 700 depicted in FIG. 7A during further processing according to an embodiment. In connection with flow of the peripheral ring SRL 724, a spiral, substantially continuous SRL 726 is formed to make contact with substantially all the solder bumps 716, including those contacted by the peripheral ring SRL 724.

In an embodiment, the peripheral ring SRL 724 and the substantially continuous SRL 726 are formed in a single, continuous dispensation of underfill material such that one pass of the X-Y gantry forms the peripheral ring SRL 724, whether it precedes, follows, or is formed simultaneously with the substantially continuous SRL 726. In any event, the amount of the underfill material is metered to cover the solder bumps 716 to an amount between about 5% and about 95% as set forth in this disclosure according to the various embodiments.

In an embodiment, other patterns can be achieved while forming the SRL 726. In an embodiment, a serpentine pattern can be dispensed where the solder bump count allows for a continuous stream of the SRL 726 to be metered onto the land side 718 of the substrate 714.

Figure 8:
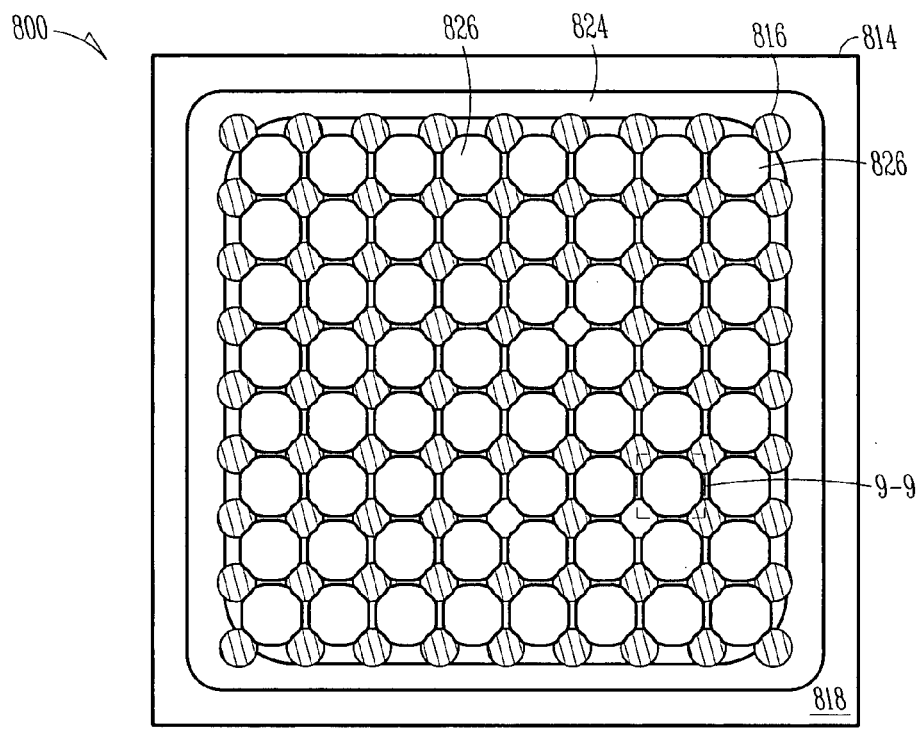
FIG. 8 is a plan of a chip package during processing according to an embodiment.

FIG. 8 is a plan of a chip package 800 during processing according to an embodiment. The chip package 800 includes a die (not pictured) that is coupled through a plurality of solder first bumps on the land side thereof, one of which is designated with the reference numeral 816.

The land side 818 of the substrate 814 depicts a solder bump array such as a ball-grid array or the like. In an embodiment, the peripheral solder bumps 816 are contacted with a peripheral ring SRL 824.

The larger array of the solder bumps 816 is processed differently to achieve a stress-relief layer. During processing a dispenser (not pictured) ejects a discrete series of quanta of compositions upon the land side 818, which is analogous to a lower surface where the die (not pictured) such as the die 110 in FIG. 1C is disposed on top of the package 102. The discrete series of quanta of compositions is also referred to by the reference numeral 826 as an SRL polymer mass 826 in an embodiment. FIG. 8 depicts flow characteristics of the discrete series of quanta of compositions 824 as it encounters a solder first bump 816.

Figure 9:
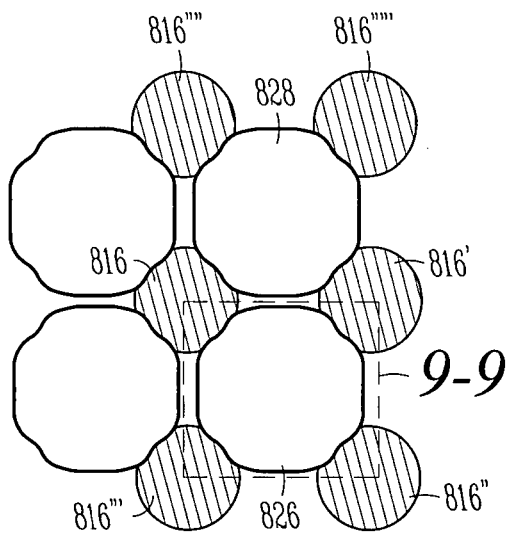
FIG. 9 is a detail of the chip package depicted in FIG. 8.

FIG. 9 is a detail section 9-9 of the chip package 800 depicted in FIG. 8. The chip package 800 details four solder bumps including a solder first bump 816, a solder second bump 816', a solder third bump 816", and a solder fourth bump 816'''.

The respective solder first-through-fourth bumps 816, 816', 816", and 816''' are arrayed around a stress-relief layer 826 that is referred to as an SRL polymer first mass 826, in a rectangular pattern 9-9 as also seen in FIG. 8. FIG. 9 depicts the SRL polymer first mass 826 to be contiguous with only the respective solder first-through-fourth bumps 816, 816', 816", and 816'''.

FIG. 9 also depicts a solder fifth bump $816^{IV}$ and a solder sixth bump $816^{V}$ that are contiguous to a portion of the stress-relief layer that is an SRL polymer second mass 828. The solder fifth bump $816^{IV}$ and solder sixth bump $816^{V}$ are in a rectangular pattern with the solder first bump 816 and the solder second bump 816'. Consequently, the SRL polymer second mass 828 is contiguous with only the solder first bump 816, the solder second bump 816', the solder fifth bump $816^{IV}$ and the solder sixth bump $816^{V}$.

For claiming purposes, an embodiment can refer to the solder fifth bump $816^{IV}$ as a solder third bump, and the solder sixth bump $816^{V}$ as a solder fourth bump. This relationship is in reference to the SRL polymer first mass 826 and the SRL polymer second mass 828.

Various embodiments are achievable by the permutation of the continuous deposition process and the discrete deposition process. For example, filled polymers are ejected to form an array of SRL polymer masses upon the land side 818 of the substrate 814. Further according to an embodiment, the height of the stress-relief layer is from about 5% of the solder bump exposed to about 95% thereof according to any of the embodiments set forth in this disclosure.

Figure 10:
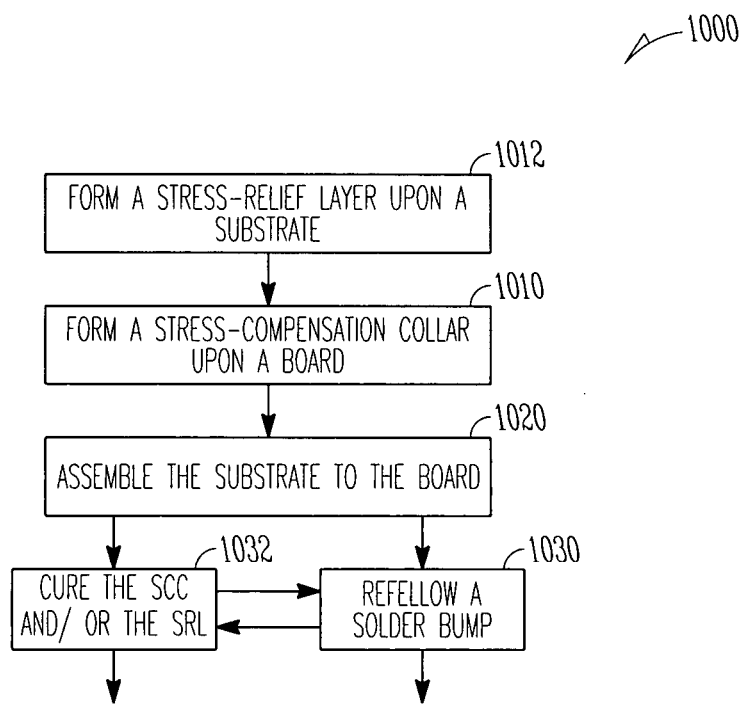
FIG. 10 is a process flow diagram according to an embodiment.

FIG. 10 is a process flow diagram 1000 according to an embodiment.

At 1010, the process includes forming a stress-compensation collar upon a board. By way of non-limiting example, an SCC 129 (FIG. 1D) is formed by pushing a solder first bump 116 (FIG. 1C) through a polymer precursor 128. In an embodiment the process terminates at 1010.

At 1012, the process optionally includes forming a stress-relief layer upon a substrate. By way of non-limiting example, an SRL 124 (FIG. 1B) is formed by ejecting a substantially continuous SRL mass upon the substrate 114. In an embodiment, a series of discrete polymer masses 826 (FIG. 8) is formed upon the substrate 814 land side 818. In an embodiment the process advances from 1012 and terminates at 1010.

At 1020, the process includes assembling the substrate to the board. In an example, the substrate is an interposer and the board is a motherboard. In an embodiment, the substrate is assembled without the presence of an SRL. In an embodiment the process terminates at 1020.

At 1030, the process includes reflowing a solder first bump that abuts the SCC. In an embodiment, the process includes a combination of curing (process 1032) at least the SCC and/or curing the SRL, and reflowing a solder first bump. In an embodiment the process terminates at 1030.

At 1032, the process includes curing at least the SCC and/or curing the SRL. In an embodiment, the process includes a combination of curing at least the SCC and additionally curing the SRL, and reflowing (process 1030) a solder first bump. In an embodiment the process terminates at 1032.

In an embodiment, the process includes reflowing a solder first bump, followed in the same or a subsequent thermal process by curing at least the SCC and additionally by curing the SRL.

Figure 11:
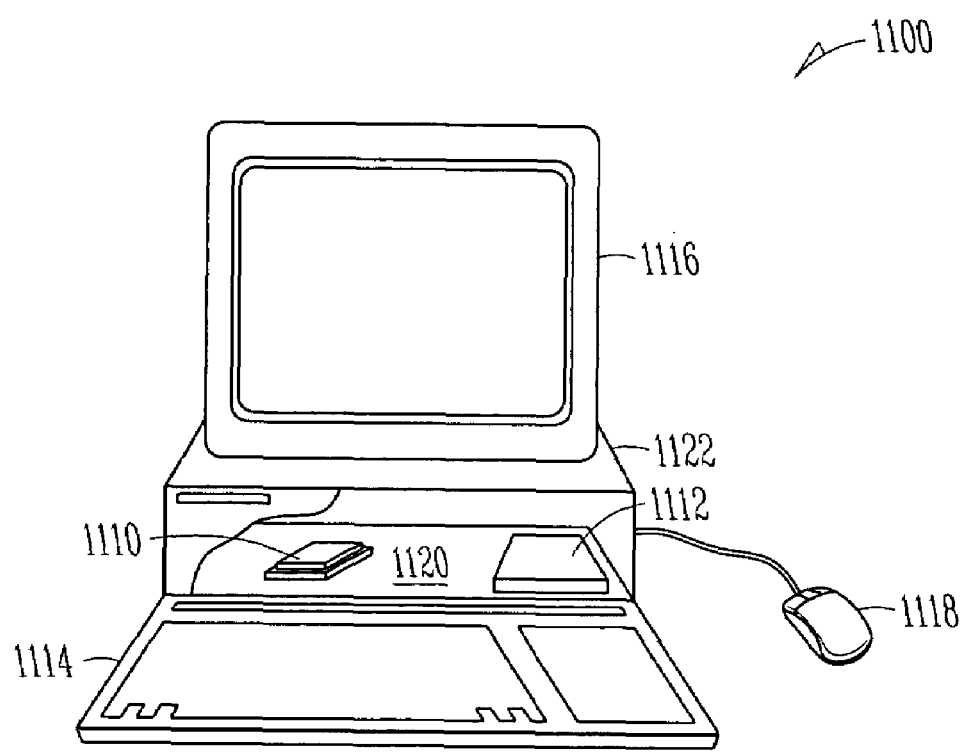
FIG. 11 is a depiction of a computing system according to an embodiment.

FIG. 11 is a depiction of a computing system according to an embodiment. The computing system 1100 includes a solder bump array with an SCC configuration according to an embodiment. One or more of the foregoing embodiments of the SCC configuration may be utilized in a computing system, such as a computing system 1100 of FIG. 11. The computing system 1100 includes at least one processor (not pictured), which is enclosed in a package 1110, a data storage system 1112, at least one input device such as keyboard 1114, and at least one output device such as monitor 1116, for example. The computing system 1100 includes a processor that processes data signals, and may include, for example, a microprocessor, available from Intel Corporation. In addition to the keyboard 1114, the computing system 1100 can include another user input device such as a mouse 1118, for example. The computing system 1100 can be analogous to the substrate 114 (FIG. 1C) and the board 126. Consequently the substrate 1110 and the board 1120 are analogous to these structures. Additionally, the computing system 1100 includes a housing 1122. As depicted, the housing 1122 is a shell for a desktop computer. Other housing embodiments are applicable depending upon the specific computing system.

For purposes of this disclosure, a computing system 1100 embodying components in accordance with the claimed subject matter may include any system that utilizes a microelectronic device system, which may include, for example, an SCC configuration that is coupled to data storage such as dynamic random access memory (DRAM), polymer memory, flash memory, and phase-change memory. In this embodiment, the SCC configuration is coupled to any combination of these functionalities by being coupled to a processor. In an embodiment, however, an SCC configuration set forth in this disclosure is coupled to any of these functionalities. For an example embodiment, data storage includes an embedded DRAM cache on a die. Additionally in an embodiment, the SCC configuration that is coupled to the processor (not pictured) is part of the system with an SCC configuration that is coupled to the data storage of the DRAM cache. Additionally in an embodiment, an SCC configuration is coupled to the data storage 1112.

In an embodiment, the computing system can also include a die that contains a digital signal processor (DSP), a micro controller, an application specific integrated circuit (ASIC), or a microprocessor. In this embodiment, the SCC configuration is coupled to any combination of these functionalities by being coupled to a processor. For an example embodiment, a DSP (not pictured) is part of a chipset that may include a stand-alone processor (in package 1110) and the DSP as separate parts of the chipset on the board 1120. In this embodiment, an SCC is coupled to the DSP, and a separate SCC configuration may be present that is coupled to the processor in package 1110. Additionally in an embodiment, an SCC configuration is coupled to a DSP that is mounted on the same board 1120 as the package 1110. It can now be appreciated that the SCC can be combined as set forth with respect to the computing system 1100, in combination with an SRL as set forth by the various embodiments of this disclosure and their equivalents.

It can now be appreciated that embodiments set forth in this disclosure can be applied to devices and apparatuses other than a traditional computer. For example, a die can be packaged with an embodiment of the SCC configuration, and placed in a portable device such as a wireless communicator or a hand-held device such as a personal data assistant and the like. Another example is a die that can be packaged with an embodiment of the SCC configuration and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   mating a microelectronic die substrate to a board, wherein the substrate includes an upper surface, a lower surface, and a solder first bump disposed on the lower surface; and while mating
   forming a stress-compensation collar (SCC) on the board, wherein the SCC abuts the solder first bump.

2. The process of claim 1, wherein forming the SCC includes embedding the solder first bump into the SCC to a depth range from about 5 percent embedded to about 95 percent embedded.

3. The process of claim 1, further including reflowing the solder first bump.

4. The process of claim 1, further including:
   reflowing the solder first bump; and
   curing the SCC.

5. The process of claim 1, wherein forming an SCC includes dispensing an SCC mass on the board.

6. The process of claim 1, wherein forming an SCC includes dispensing an SCC mass on the board, wherein the SCC mass includes a plurality of spaced-apart spots.

7. The process of claim 1, wherein mating includes mating through an uncured organic composition that includes a non-fugitive element in the composition, and wherein the composition includes at least one material selected from an epoxy solder paste, an epoxy flux, and combinations thereof.

8. The process of claim 1, wherein mating includes mating through an uncured organic composition that includes a non-fugitive element in the composition, and wherein the composition includes at least one material selected from a resin-containing flux, a cyanate ester-containing flux, a polyimide-containing flux, a polybenzoxazole-containing flux, a polybenzimidazole-containing flux, a polybenzothiazole-containing flux, a polymer-solder-flux paste, and combinations thereof.

9. The process of claim 1, wherein mating includes mating through an uncured organic composition that includes a non-fugitive element in the composition, and wherein the composition includes at least one material selected from a paste, a solder paste, an epoxy-containing solder paste, a resin-containing paste, a cyanate ester-containing paste, a polyimide-containing paste, a polybenzoxazole-containing paste, a polybenzimidazole-containing paste, a polybenzothiazole-containing paste, a flux, and combinations thereof.

10. The process of claim 1, wherein forming an SCC includes dispensing a single SCC mass on the board.

11. The process of claim 1, before mating, the process including:
forming a stress-relief layer (SRL) upon the substrate lower surface, wherein the SRL partially embeds the solder first bump.

12. The process of claim 1, further including:
forming an SRL upon the substrate lower surface, wherein the SRL partially embeds the solder first bump; and
reflowing the solder first bump.

13. The process of claim 1, further including:
forming an SRL upon the substrate lower surface, wherein the SRL partially embeds the solder first bump;
reflowing the solder first bump; and
curing at least one of the SCC and the SRL.

14. A process comprising: forming a stress-relief layer peripheral ring on a microelectronic die substrate that touches a plurality of peripheral solder bumps on the microelectronic die substrate;
mating the microelectronic die substrate to a board, wherein the microelectronic die substrate includes an upper surface, a lower surface, and the plurality of peripheral solder bumps disposed on the lower surface; and while mating
forming a stress-compensation collar (SCC) on the microelectronic die substrate, wherein the SCC abuts the plurality of peripheral solder bumps, and wherein forming the SCC includes a stream of mass disposed upon the microelectronic die substrate and under conditions to embed the plurality of peripheral solder bumps.

15. The process of claim 14, wherein forming a stress-compensation collar includes embedding the plurality of peripheral solder bumps into the SCC to a depth range from about 5 percent embedded to about 95 percent embedded.

16. The process of claim 14, wherein forming a stress-compensation collar includes using an X-Y gantry to deposit the SCC.

17. The process of claim 14, wherein forming a stress-compensation collar includes using an X-Y gantry to deposit the SCC, and wherein the stream of mass substantially contacts about half or more of each circumference of the plurality of peripheral solder bumps.

18. The process of claim 14, wherein forming a stress-compensation collar includes using an X-Y gantry to deposit the SCC, and wherein the stream of mass substantially contacts about half or more of the circumference of each circumference of the plurality of peripheral solder bumps, and wherein forming a stress-compensation collar includes embedding the plurality of peripheral solder bumps into the SCC to a depth range from about 5 percent embedded to about 95 percent embedded.

19. A process comprising:
forming a stress-relief layer peripheral ring on a microelectronic die substrate that touches a plurality of peripheral solder bumps on the microelectronic die substrate;
mating the microelectronic die substrate to a board, wherein the microelectronic die substrate includes an upper surface, a lower surface, and the plurality of peripheral solder bumps disposed on the lower surface; and while mating
forming a stress-relief layer on the microelectronic die substrate, wherein the stress-relief layer abuts the plurality of peripheral solder bumps, and wherein forming the stress-relief layer includes dispensing a discrete series of a polymer mass upon the microelectronic die substrate and under conditions to embed the plurality of peripheral solder bumps.

20. The process of claim 19, wherein forming a stress-relief layer on the microelectronic die substrate dispensing includes embedding the plurality of peripheral solder bumps into the stress-relief layer to a depth range from about 5 percent embedded to about 95 percent embedded.

21. The process of claim 19, wherein dispensing includes using an X-Y gantry to deposit the stress-relief layer.

* * * * *